United States Patent [19]
Okabe et al.

[11] Patent Number: 5,925,911
[45] Date of Patent: *Jul. 20, 1999

[54] SEMICONDUCTOR DEVICE IN WHICH DEFECTS DUE TO LOCOS OR HEAT TREATMENT ARE SUPPRESSED

[75] Inventors: Naoto Okabe, Chita-gun; Tsuyoshi Yamamoto; Mitsuhiro Kataoka, both of Kariya, all of Japan

[73] Assignee: Nippondenso Co., Ltd., Kariya, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/638,374

[22] Filed: Apr. 26, 1996

[30] Foreign Application Priority Data

Apr. 26, 1995 [JP] Japan ................................. 7-102341

[51] Int. Cl.⁶ ........................... H01L 29/76; H01L 29/94; H01L 31/062; H01L 31/113
[52] U.S. Cl. ........................... 257/341; 257/335; 257/329
[58] Field of Search ..................... 257/341, 342, 257/133, 139, 329, 401, 263, 335, 408, 328, 302, 330; 438/173, 156, 206

[56] References Cited

U.S. PATENT DOCUMENTS

| 4,589,004 | 5/1986 | Yasuda et al. ........................ 357/23.4 |
| 5,242,862 | 9/1993 | Okabe et al. ........................... 437/225 |
| 5,430,316 | 7/1995 | Contiero et al. ....................... 257/335 |
| 5,460,985 | 10/1995 | Tokura et al. ........................... 437/40 |
| 5,463,241 | 10/1995 | Kubo ....................................... 257/382 |
| 5,470,770 | 11/1995 | Takahashi et al. ..................... 437/41 |
| 5,541,430 | 7/1996 | Terashima .............................. 257/341 |
| 5,698,880 | 12/1997 | Takahashi et al. ..................... 257/341 |
| 5,776,812 | 7/1998 | Takahashi et al. ..................... 438/268 |
| 5,780,324 | 7/1998 | Tokuna et al. ......................... 438/138 |

FOREIGN PATENT DOCUMENTS

| 471526 | 2/1992 | European Pat. Off. . |
| 0 550 770 | 7/1993 | European Pat. Off. . |
| 594049 | 4/1994 | European Pat. Off. . |
| 58-42274 | 3/1983 | Japan ................................ 257/335 |
| 61-199666 | 9/1986 | Japan . |
| 62-012167 | 1/1987 | Japan . |
| 3-270273 | 2/1991 | Japan ................................ 257/341 |
| 6-232396 | 8/1994 | Japan ................................ 257/341 |
| 2 071 412 | 9/1981 | United Kingdom . |
| 2 198 583 | 6/1988 | United Kingdom . |
| WO86/01638 | 3/1986 | WIPO . |

OTHER PUBLICATIONS

Extended Abstracts, vol. 79–2, Oct. 14–19, 1979, J.A. Topich et al. "Gettering Studies on Oxidation and Epitaxial Defects for Diffused and Implanted Burief Layer Processes", p. 1268, line 4–20.

Patent Abstracts of Japan, Pub. No. 05152306, Jun. 1993, "Semiconductor Substrate and Manufacture Thereof".

(List continued on next page.)

*Primary Examiner*—Olik Chaudhuri
*Assistant Examiner*—Phat X. Cao
*Attorney, Agent, or Firm*—Pillsbury Madison & Sutro LLP

[57] ABSTRACT

A semiconductor device having a concavity formed by LOCOS technique, in which defects induced due to the LOCOS oxidation step or a following heat-treatment step are suppressed, is disclosed. An $n^+$ type region, the impurity concentration of which is caused to be $1 \times 10^{19}$ cm$^{-3}$ or more, is formed in an $n^-$ type semiconductor layer. By means of this, defects occur within the $n^+$ type region or in a proximity of the boundary of the $n^+$ type region and the $n^-$ type semiconductor layer. The defects trap contaminant impurities taken into the wafer during the manufacturing steps, and cause contaminant impurities existing in the proximity of a concavity of the semiconductor surface to be reduced. As a result thereof, defect occurrence in the proximity of the concavity can be suppressed, and occurrence of leakage and degradation in breakdown voltage between drain and source accompanying defect occurrence in a channel region can be suppressed.

10 Claims, 5 Drawing Sheets

OTHER PUBLICATIONS

Electronics, "Low–Dislocation Process Promises Low–Noise Devices", vol. 43, No. 21, Oct. 12, 1970, pp. 171–172.

Patent Abstracts of Japan, Pub. No. 01282872, Nov. 1989, "Semiconductor Device".

Beyer et al., "Elimination of Stacking Faults", IBM Technical Disclosure Bulletin, vol. 19, No. 8, Jan. 1977, pp. 3051–3052.

E.H. Bogardus, et al. "Gettering Technique and Structure", IBM Technical Disclosure Bulletin, vol. 16, No. 4, Sep. 1993, pp. 1066–1067.

W.A. Keenan, et al. "Gettering Technique", IBM Technical Disclosure Bulletin, vol. 15, No. 6, Nov. 1972, p. 1755.

P.L. Garbarino, et al. "Gettering and Reactive Ion Etching to Improve Device Leakages and Yield", IBM Technical Disclosure Bulletin, vol. 20, No. 4, Sep. 1977, pp. 1389–1390.

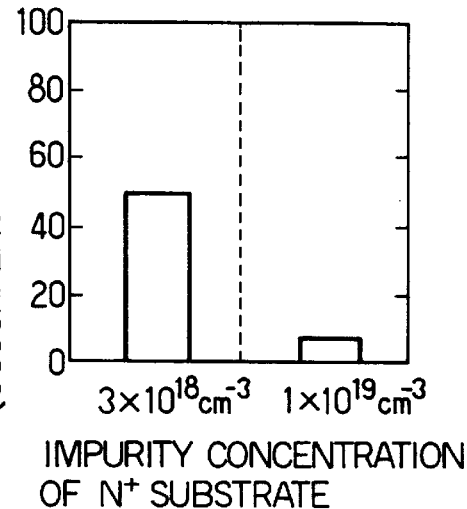
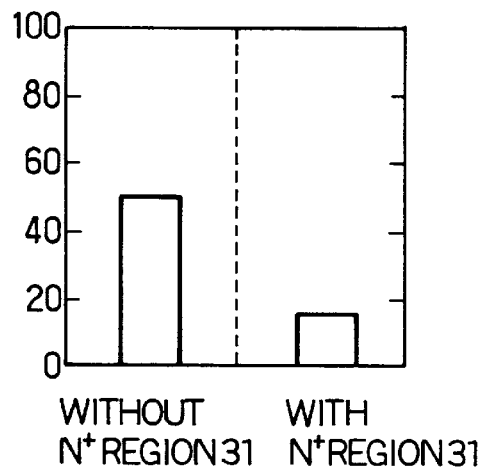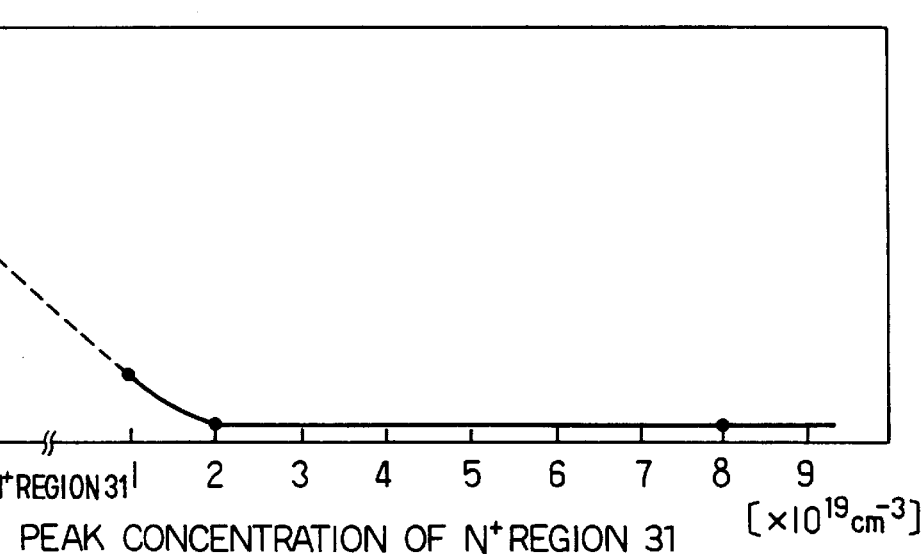

SEMICONDUCTOR DEVICE IN WHICH DEFECTS DUE TO LOCOS OR HEAT TREATMENT ARE SUPPRESSED

CROSS REFERENCE TO RELATED APPLICATION

This application is based upon and claims the benefit of priority of the prior Japanese Patent Application No. 7-102341 filed on Apr. 26, 1995, the contents of which are incorporated herein by reference.

BACKGROUND OF THE INVENTION

1. Field of the Invention

The present invention generally relates to a semiconductor device used as a power semiconductor device, e.g., a vertical or lateral MOSFET (metal oxide semiconductor field effect transistor) and a vertical or lateral IGBT (insulated gate bipolar transistor). The semiconductor device of the present invention can suitably be employed for a MOS-IC, etc. as a single unit or with the incorporation of a power semiconductor device.

2. Related Arts

Recently, a vertical type power MOSFET has been used in many industrial fields for various features thereof such as high frequency characteristics, fast switching speed and low power driving. Along with the spread of the vertical power MOSFET, there is an increasing demand for lower loss and lower cost, while the ON-resistance reduction by means of microprocessing and cell shape improvement has reached its limit. For example, a planar type DMOSFET has the minimal point from which the ON-resistance will not decrease even if the unit cell dimension is miniaturized, and it has been known that the major cause of the existence of the minimal point is an increase in the JFET (junction field effect transistor) resistance located between two adjacent body junctions.

Various constructions have been proposed in an attempt to break through this limit. Common to these proposals is a construction in which a groove is formed on an element surface and a channel part (inversion layer formation region) is disposed on a side surface of the groove. By this construction, even if the unit cell dimension is reduced, the consequent increase in the JFET resistance is negligible.

An example of the conventional manufacturing method with the above construction with the channel part on the side surface of the groove has been disclosed in the Japanese Unexamined Patent Publication No. 61-199666, for example, in which the groove is formed by means of RIE (reactive ion etching) and the channel part is formed on the side surface of the formed groove. Here, the RIE is a physical etching technique with a high process controllability and features an excellent anisotropy and a consequent high resistance to side etch due to the acceleration of ionized gas in a constant direction. However, there is a problem with the RIE that as the ionized gas physically collides against the semiconductor device, a lattice defect is inevitably caused in the etched surface; consequently channel mobility is degraded; and as a result, the ON-resistance increases.

As manufacturing methods which can control a lattice defect, there have been disclosed manufacturing methods using wet etching techniques in International Publication No. PCT WO93/03502 and the Japanese Unexamined Patent Publication No. 62-12167, for example. The proposed DMOS structure has a concave or bathtub-shaped groove structure fabricated by a combination of local oxidation of silicon (LOCOS) technique and chemically etching off the formed thick oxide film (hereinafter referred to as a LOCOS oxide film), which obtains the elimination of JFET resistance while suppressing the occurrence of lattice defects by means of the concave configuration thereof to obtain a high channel mobility.

SUMMARY OF THE INVENTION

However, according to the manufacturing methods disclosed in the above International Publication No. PCT WO93/03502 and the Japanese Unexamined Patent Publication No. 62-12167, the inventors of the present invention found from their extensive research and repetitive experiments that there is a novel problem that a defect due to another cause may be introduced. Namely, when there is contamination due to a deleterious impurity (for example a heavy-metal impurity) before or after the formation step for the LOCOS oxide film to obtain the concavity, there may be cases where an OSF (oxidation-induced stacking fault) occurs during formation of the LOCOS oxide film, or a dislocation, i.e., line defect, occurs due to heat treatment after formation of the LOCOS oxide film. These defects adversely affect element electric characteristics after completion of the final step, and it was understood from experimentation by the inventors that these defects may trigger an increase in leakage current between drain and source or a degradation (reduction) in breakdown voltage, thereby causing element yield to be reduced.

In light of the foregoing problems, it is an object of the present invention to suppress, in a MOSFET which has a channel region defined at a sidewall surface of a concavity formed by utilizing a LOCOS technique, occurrence of defects in the LOCOS oxidation step or in a heat-treatment step conducted thereafter, causing electric characteristics of resultant elements to be favorable, and as a result thereof, to cause yield to be improved.

The semiconductor device according to the present invention has a DMOS structure, a channel region of which is defined at an inner wall surface of a concavity fabricated by a combination of LOCOS technique and etching off the formed LOCOS oxide film, formed on a semiconductor layer of a first conductivity type, and further comprises a high-concentration region, an impurity concentration of which is higher than the semiconductor layer and is $1\times10^{19}$ cm$^{-3}$ or more, provided within the semiconductor layer on an outer side of a region where the DMOS structure is disposed.

According to the above-described structure, a high-concentration region of $1\times10^{19}$ cm$^{-3}$ or more is formed outside a DMOS cell region in which a body region and source region which form the DMOS structure are repeatedly formed, and so crystal defects within the high-concentration region, as well as a crystalline-strain region due to a discrepancy in a lattice constant at the boundary of the high-concentration region and the semiconductor layer of the DMOS cell region side, occur. Deleterious contaminating impurities which invade during wafer processing can be caused to be trapped by these crystal defects. According to the present structure, there is no need to previously form crystal defects in the semiconductor substrate itself, and so there is no loss of crystallinity of a semiconductor layer ordinary formed on the semiconductor substrate by an epitaxial growth method. Consequently, shortening of the lifetime of minority carriers is prevented, and in a case such as where bipolar ICs are integrated, the electric characteristics of circuit elements are not subjected to adverse effects.

BRIEF DESCRIPTION OF THE DRAWINGS

These and other objects, features and characteristics of the present invention will be appreciated from a study of the following detailed description, the appended claims, and drawings, all of which form a part of this application. In the drawings:

FIG. 11 is a diagram indicating a defect rate relating to drain-source current leakage in the concave type MOSFET according to the proposed stage of the present invention;

FIG. 12 is a diagram indicating a defect rate relating to drain-source current leakage in the concave type MOSFET according to the first embodiment of the present invention; and FIG. 13 is a diagram indicating a defect rate relating to drain-source current leakage in the concave type MOSFET according to the first embodiment of the present invention.

DETAILED DESCRIPTION OF THE PRESENTLY PREFERRED EXEMPLARY EMBODIMENTS

Embodiments of the present invention will be described hereinafter with reference to the drawings.

Figure 1:
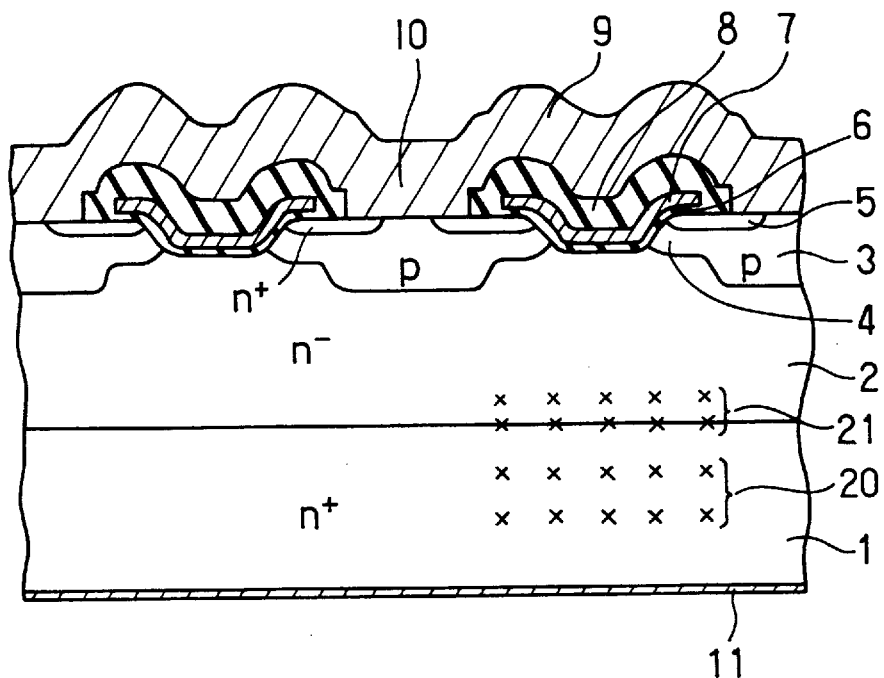
FIG. 1 is a sectional view indicating a structure of a concave type MOSFET according to a proposed stage of the present invention.

FIG. 1 is a sectional view of a unit-cell of a concave type MOSFET according to a proposed stage of the present invention. The structure of the concave type MOSFET will be described hereinafter in accordance with a fabrication method thereof.

An $n^+$ type silicon substrate 1, which has a predetermined thickness (for example approximately 100 to 700 $\mu$m), has an impurity concentration of $1 \times 10^{19}$ cm$^{-3}$ or more, and is doped with arsenic as the impurity, is prepared. An $n^-$ type silicon layer 2 having an impurity concentration lower (for example, $1 \times 10^{17}$ cm$^{-3}$ or less) than the $n^+$ type silicon substrate 1 is formed on the $n^+$ type silicon substrate 1 by, for example, an epitaxial growth method. The $n^-$ type silicon layer 2 is doped with phosphorus as the impurity. At this stage, the surface of the silicon layer 2 is flat. The surface of the silicon layer 2 is caused to be oxidized using a LOCOS method to form a LOCOS oxide film. At this time, the surface of the silicon layer 2 is eroded with the growth of the LOCOS oxide film. Then, a p type body region 4 and an $n^+$ type source region 5 are sequentially formed on the surface of the silicon layer 2 utilizing an ion-implantation method and thermal-diffusion method, while employing the LOCOS oxide film as a diffusion mask. Next, the LOCOS oxide film is etched away to form a concavity on the surface of the silicon layer 2, and a gate insulating film 6 is formed on the surface of the silicon layer 2; a gate electrode 7 is formed on the gate insulating film 6 in the concavity; and an interlayer insulation film 8 (for example, BPSG: borophosphorsilicate glass) is formed on the gate electrode 7. Further, the gate insulating film 6 and the interlayer insulation film 8 are partially etched away to form a contact hole 10, and more-over a source electrode 9 is formed so as to contact the $n^+$ type source region 5 and p type body region 4 via the contact hole 10. Then, a drain electrode 11 which contacts a rear surface of the silicon substrate 1 is formed.

According to the concave type MOSFET shown in FIG. 1, arsenic is employed as the impurity of the $n^+$ type silicon substrate 1, concentration thereof is caused to be a high concentration of $1 \times 10^{19}$ cm$^{-3}$ or more, and the impurity concentration of the silicon layer 2 is caused to be lower than the impurity concentration of the $n^+$ type silicon substrate 1. Due to this structure, defects ("X" symbols 20 in FIG. 1) caused by crystalline strain due to the high impurity concentration of the $n^+$ type silicon substrate 1 and defects ("X" symbols 21 in FIG. 1) caused by crystalline strain due to a difference in impurity concentration in a proximity of the boundary of the $n^+$ type silicon substrate 1 and $n^-$ type silicon layer 2 occur. The defects 20 and 21 trap deleterious contaminant impurities (for example, heavy-metal impurities and the like) taken into the silicon substrate 1 (semiconductor substrate) and silicon layer 2 (semiconductor layer) in the wafer processing steps, and act as an internal gettering or intrinsic gettering to cause contaminant impurities existing in the proximity of the concavity of the semiconductor surface to be reduced. As a result thereof, defect occurrence in the proximity of the concavity can be suppressed, occurrence of leakage and decline in breakdown voltage between the drain electrode 11 and source electrode 9 accompanying defect occurrence in the channel region can be suppressed, and yield can be improved.

An influence of the impurity of the $n^+$ type silicon substrate 1 and the concentration thereof on defect rate relating to current leakage between drain and source were investigated through experimentation. This is indicated in FIG. 11. Two types of silicon wafers, i.e., an A type wafer comprising a (100)-oriented $n^+$ type silicon substrate (impurity: antimony [Sb], impurity concentration: $3 \times 10^{18}$ cm$^{-3}$, diameter: 5 inches) and an $n^-$ type silicon layer grown on the substrate by epitaxial growth method, and a B type wafer comprising a (100)-oriented $n^+$ type silicon substrate (impurity: arsenic [As], impurity concentration: $1 \times 10^{19}$ cm$^{-3}$, diameter: 5 inches) and an $n^-$ type silicon layer grown on the substrate by epitaxial growth method, were employed in the experimentation. Each silicon layer formed on the respective substrates for A and B types is doped with phosphorus as the impurity, and has a thickness of 7.5 $\mu$m and impurity concentration of $7.5 \times 10^{15}$ cm$^{-3}$. These two types of wafers were employed to fabricate elements in identical lots and with identical steps. As a result of this, the defect rate, i.e., the occurrence ratio of drain-source leakage, was 50% for the A type wafer and 7% for the B type wafer. It was confirmed from this result that the occurrence ratio of drain-source leakage is reduced and yield is improved by utilizing a high impurity concentration with arsenic as the impurity of the semiconductor substrate.

Here, in the experimentation for determining leakage occurrence ratio, the wafer through which a current of 1 $\mu$A or more flowed was taken to be defective when 55 V was applied to the drain while the source and gate were at 0 V. Defect rates indicated in FIGS. 12 and 13 were also evaluated through similar testing.

Accordingly, on the basis of this result, the inventors of the present invention conceived of a structure a high-concentration region on an outer side of the p type body region 4 and concavity.

Figure 2:
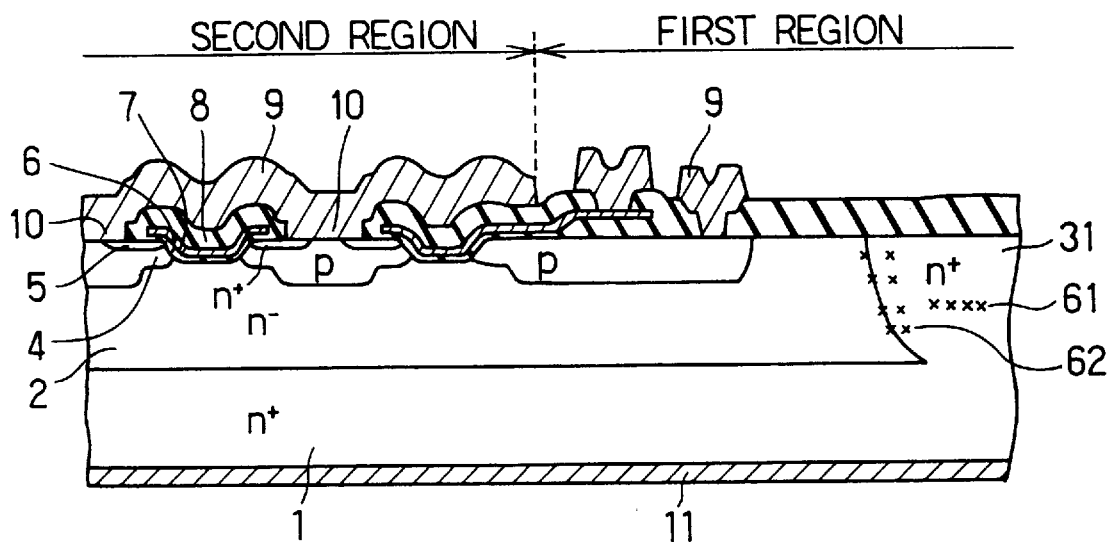
FIG. 2 is a sectional view indicating a structure of a concave type MOSFET according to a first embodiment of the present invention.

FIG. 2 indicates a sectional view of a concave type MOSFET according to a first embodiment of the present invention. The structure of the concave type MOSFET of the present embodiment will be described hereinafter in accordance with a fabrication method thereof.

Figure 3:
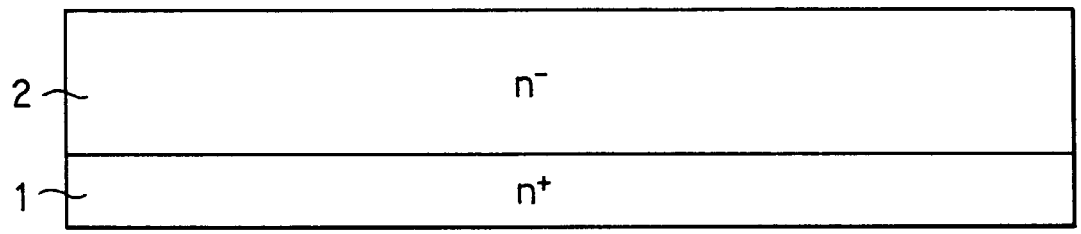
FIG. 3 through FIG. 9 are sectional views for explanation of fabrication steps of the concave type MOSFET according to the first embodiment.

An n+ type silicon substrate 1 (semiconductor substrate) of a predetermined thickness (for example, approximately 100 μm to 700 μm) is prepared. An n− type silicon layer 2 (semiconductor layer) having an impurity concentration which is lower (for example, an impurity concentration of $1 \times 10^{17}$ cm$^{-3}$ or less, with the impurity being phosphorus) than the n+ type silicon substrate 1 is formed on the n+ type silicon substrate 1 by, for example, an epitaxial growth method (FIG. 3). At this stage, the surface of the silicon layer 2 is flat.

Figure 4:
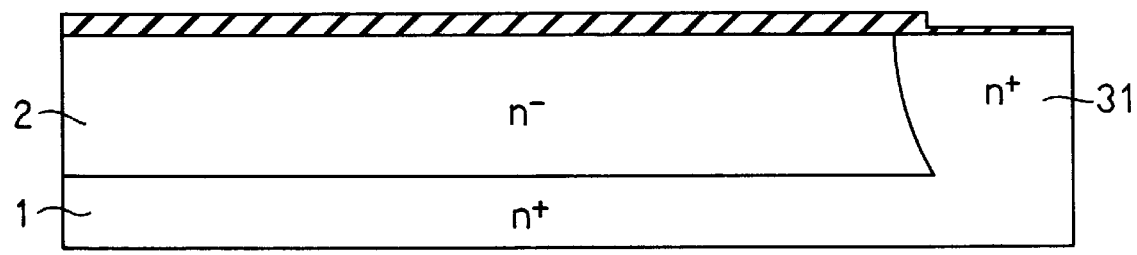

Then, n type impurities are caused to be permeated from a surface of a first region of the silicon layer 2 by thermal diffusion with an oxide film as a mask, forming an n+ type region 31 of high oncentrated substrate 1 (figure the silicon substrate 1 (FIG. 4).

Figure 5:
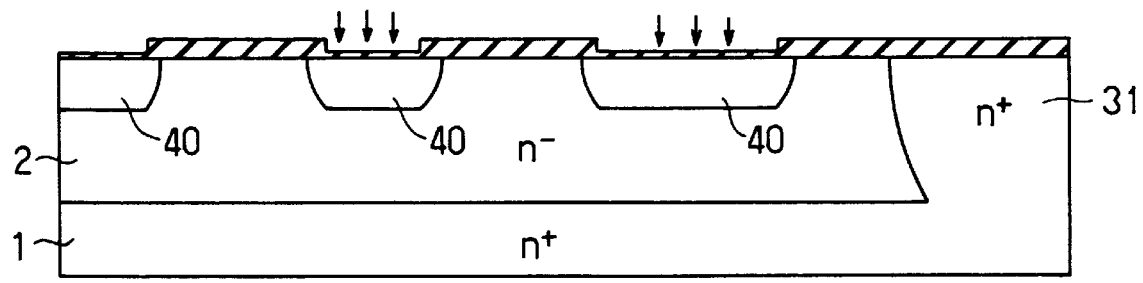

A p type diffusion region (deep-well) 40 is selectively formed on the surface of the silicon layer 2 by ion-implantation and subsequent thermal treatment, with the oxide film as the mask (FIG. 5).

Figure 6:
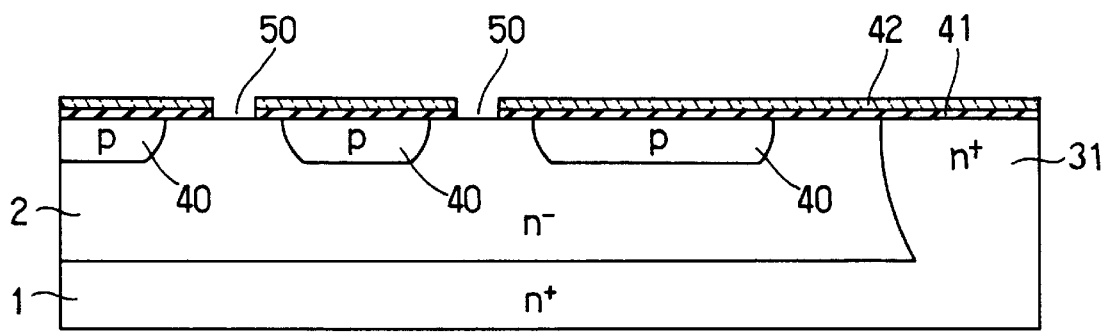
Figure 7:
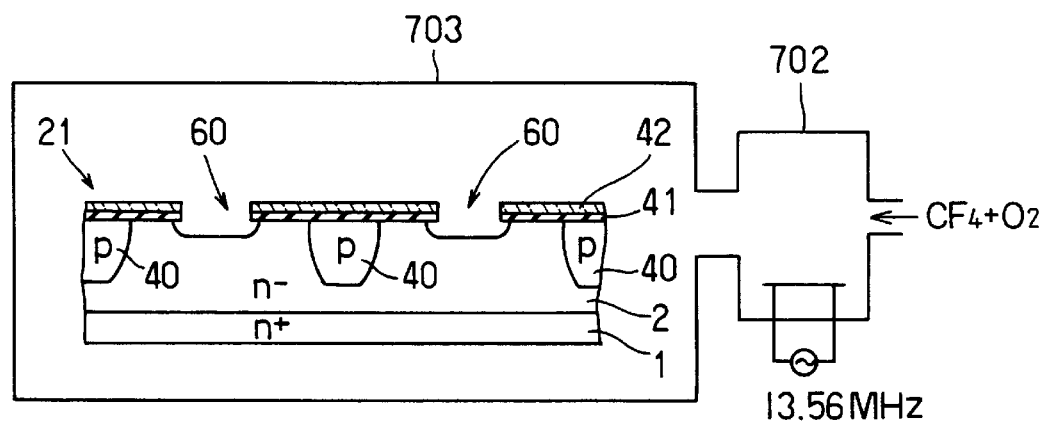

An oxide film 41 and silicon nitride film 42 are formed on the surface of the silicon layer 2, etching using photolithography is then performed to form an opening 50 (FIG. 6). Next, as is shown in FIG. 7, chemical dry etching is performed on the n− type silicon layer 2 to form an initial groove 60. The chemical dry etching is performed as follows: a plasma is generated in a discharge chamber 702 containing carbon tetrafluoride which is a reactive gas and oxygen gas to create chemical activated species (fluorine radical F*); these activated species are transferred to a reaction chamber 703; and chemical dry etching of the n− type epitaxial layer 2 is isotropically performed in the reaction chamber 703.

Figure 8:
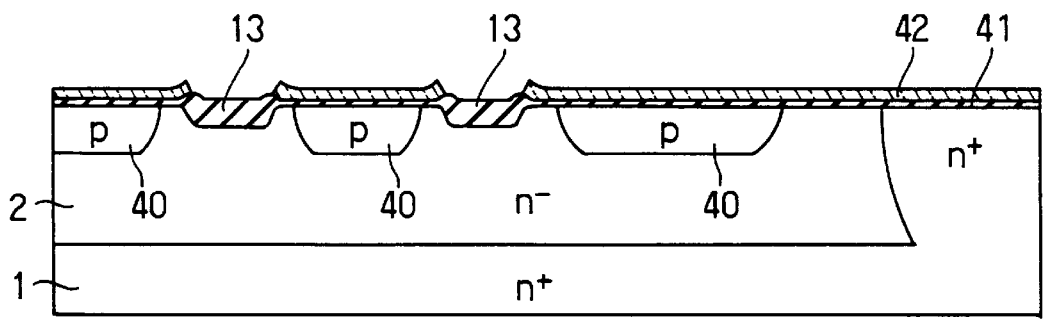
Figure 9:
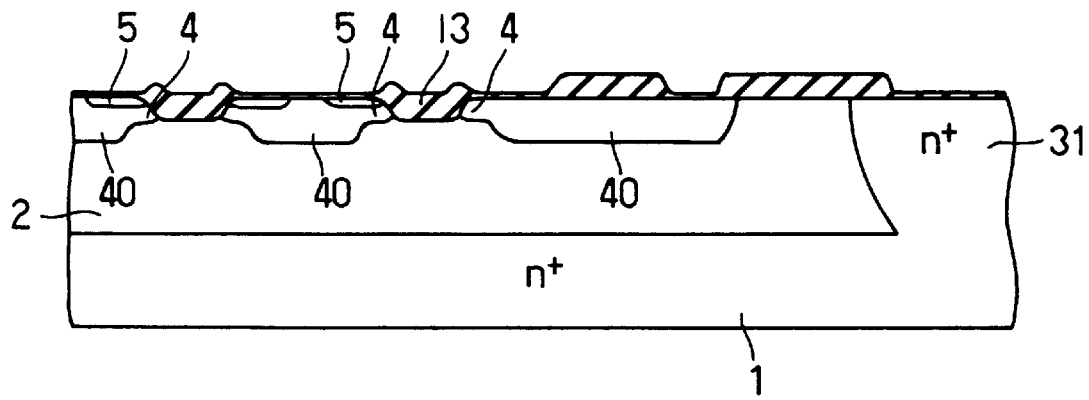

Next, a LOCOS oxide film 13 is formed by a LOCOS oxidation method on a surface of a second region (FIG. 2) of the silicon layer 2, appropriating the mask during the above-described chemical dry etching of the region formed with the initial groove 60 (see FIG. 8). After etching away the silicon nitride film 42, a double-diffusion technique is performed on the surface of the silicon layer 2 using the LOCOS oxide film 13 as a double-diffusion mask. That is, an ion-implantation of p type impurities and thermal-diffusion therefor and an ion-implantation of n type impurities and thermal-diffusion therefor are sequentially performed while employing the LOCOS oxide film 13 as a mask to form a p type body region (channel-well) 4 and an n+ type source region 5 (FIG. 9). During these ion-implantation steps, it is preferred that the first region be masked with photoresist or the like.

Then, the LOCOS oxide film 13 is etched away, thereby exposing a concavity formed by the erosion due to the growth of the LOCOS oxide film 13. A gate insulating film 6 is formed on the surface of the silicon layer 2 by thermal oxidation, polysilicon is deposited on the gate insulating film 6 utilizing a vapor-phase deposition method or the like, and patterning is performed on the deposited polysilicon to form a gate electrode 7. The gate electrode 7 is located on the silicon layer 2 along the concavity with the gate insulating film 6 interposed therebetween. An interlayer insulation film (for example, BPSG) is formed on the gate electrode 7 utilizing a vapor-phase deposition method or the like. Further, the gate insulating film 6 and interlayer insulation film 8 are partially etched away, forming an contact hole 10, and moreover a source electrode 9 is formed so as to contact the n+ type source region 5 and p type body region 4 via the contact hole 10. A drain electrode 11 which contacts a rear surface of the silicon substrate 1 is also formed to complete the concave type vertical MOSFET shown in FIG. 2.

In the structure of the concave type MOSFET formed by the foregoing fabrication method, defects ("X" symbols 61 in FIG. 2) caused by crystalline strain within the n+ type region 31 and defects ("X" symbols 62 in FIG. 2) caused by crystalline strain due to a difference in impurity concentration in a proximity of the boundary of the n+ type region 31 and the n− type silicon layer 2 occur by forming the n+ type region 31 by, for example, phosphorus deposition and thermal diffusion and by causing surface concentration of the n+ type region 31 to be $1 \times 10^{19}$ cm$^{-3}$ or more. The defects 61 and 62 trap deleterious contaminant impurities (for example, heavy-metal impurities) taken into the semiconductor wafer (silicon substrate 1 and silicon layer 2) in the wafer processing steps, and act as a gettering site to cause contaminant impurities existing in the proximity of the concavity of the wafer surface to be reduced. As a result thereof, defect occurrence in the proximity of the concavity can be suppressed, occurrence of leakage and reduction in breakdown voltage between the drain electrode 11 and source electrode 9 accompanying defect occurrence in the channel region can be suppressed, and yield can be improved.

Herein, it is also acceptable for the n+ type region 31 to be formed with arsenic or another impurity.

Difference in yield due to presence or absence of the n+ type region 31 was evaluated by experimentation. The results are indicated in FIG. 12. Structure of the n+ type silicon substrate 1 was as follows: (100)-oriented substrate; diameter of 5 inches; doped with antimony as the impurity; and impurity concentration of $3 \times 10^{18}$ cm$^{-3}$. Structure of the silicon layer 2 formed by the epitaxial growth method was as follows: thickness of 7.5 μm; doped with phosphorus as the impurity; and impurity concentration of $7.5 \times 10^{15}$ cm$^{-3}$. On such silicon wafers were formed the concave type MOSFET shown in FIG. 2 in identical lots and with identical steps, and is subjected to experimentation. The result of evaluation of electric characteristics indicated an occurrence ratio of leakage between the drain electrode 11 and source electrode 9 of 50% in a case where an n+ type region 31 was absent, and 16% in a case where the n+ type region 31 was present. It was thereby confirmed that yield is improved by providing an n+ type region 31. Additionally, the relationship between the drain-source leakage occurrence ratios and the surface concentration of the n+ type region 31 are indicated in FIG. 13. According to FIG. 13, it is preferred that the surface concentration of the n+ type region 31 be on the order of $10^{19}$ cm$^{-3}$ or more.

Herein, it is also acceptable for the n+ type silicon substrate 1 to be doped with arsenic, instead of antimony, like in the structure of FIG. 1. Further, it is also acceptable for the silicon substrate 1 to be selected to have an impurity concentration of $1 \times 10^{19}$ cm$^{-3}$ or more, like in the structure of FIG. 1.

Figure 10:
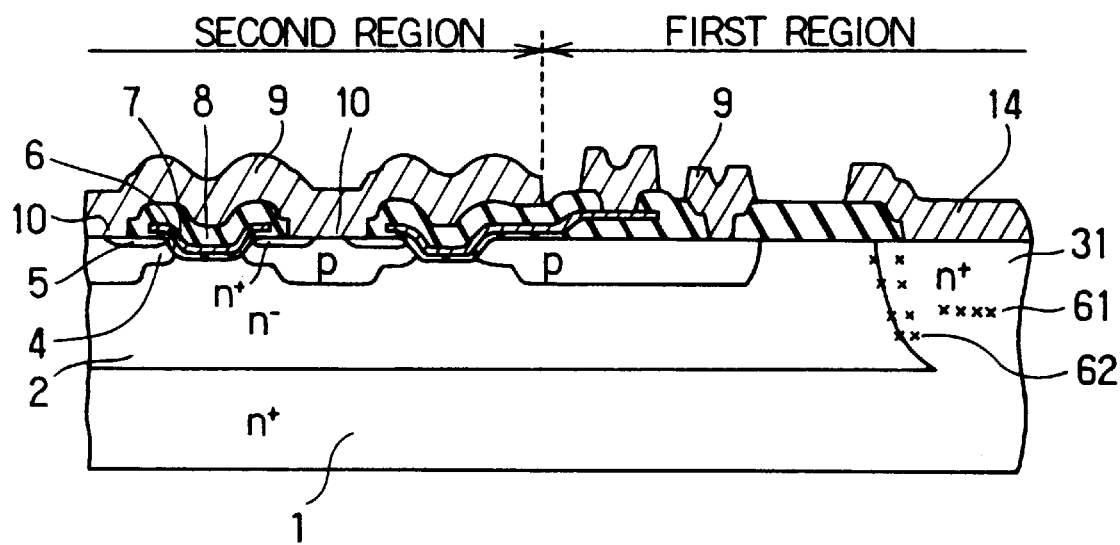
FIG. 10 is a sectional view indicating a structure of a concave type MOSFET according to another embodiment of the present invention.

FIG. 2 indicates an example of a vertical type DMOSFET structure formed by causing a drain electrode to contact an n+ type silicon substrate 1. However, another embodiment indicated in FIG. 10 is a so-called lateral type DMOSFET structure which utilizes a surface drain electrode 14 which causes a drain electrode to contact an n+ type region 31. Needless to say, a similar effect can be attained in the present structure as well. In this case, there exists an advantage that the n+ type region 31 can double in use as a defect-occurrence suppression region and a drain region.

Furthermore, the embodiments are described by utilizing an n-channel type MOSFET structure, but a similar effect is obtained also when the present invention has an IGBT structure of a semiconductor layer and semiconductor substrate of differing conductivity types.

Moreover, it is also acceptable for the initial groove 60 to be formed not by chemical dry etching, but rather by dry etching where the discharge chamber and reaction chamber are a single chamber, or by reactive ion etching (RIE) where the substrate to be etched is positioned at a negative electrode, a plasma side is a positive electrode, and ions collide against the substrate surface to promote etching. In this case, however, the initial groove 60 is more susceptible to damage in comparison with a case of formation by chemical dry etching.

Additionally, it is also acceptable for the initial groove 60 to be formed not by dry etching employing a reactive gas as described above, but rather by wet etching being isotropic etching by $HF+HNO_3$ (fluoronitric acid), anisotropic etching by KOH (potassium hydroxide), or the like.

Further, because it is an object of the present invention to suppress an effect of an OSF defect during LOCOS oxidation, it is necessary to form the $n^+$ type region 31 previously to at least the LOCOS oxidation step. Additionally, because there exists a susceptibility to contamination by heavy metal during the chemical dry etching step to form the initial groove 60, it is further preferred that the $n^+$ type region 31 be formed previously to formation of the initial groove 60.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor device comprising:
   a semiconductor substrate having two mutually opposing surfaces;
   a semiconductor layer of a first conductivity type which contacts one surface of said semiconductor substrate and has a lower impurity concentration than said semiconductor substrate, a concavity being disposed at a surface of said semiconductor layer;
   a body region of a second conductivity type in contact with a side of said concavity;
   a source region of said first conductivity type, in said body region, defining a channel region along with said body region at said side of said concavity;
   a gate electrode disposed at least over said channel region with a gate insulating film interposed therebetween;
   a source electrode electrically connected to said body region and said source region;
   a high-concentration region, an impurity concentration of which is higher than said semiconductor layer and is at least $1\times10^{19}$ $cm^{-3}$, provided within said semiconductor layer on an outer side of a cell region where said concavity, said body region, and said source region are disposed; and
   a second conductivity type region disposed within said semiconductor layer between said high-concentration region and said concavity located at an end portion of said cell region to be in contact with a side of said concavity located at an end portion of said cell region, no source region being formed in said second conductivity type region.

2. A semiconductor device according to claim 1, wherein said high-concentration region extends from a surface of said semiconductor layer to said semiconductor substrate.

3. A semiconductor device according to claim 2, further comprising a drain electrode contacting said high-concentration region.

4. A semiconductor device according to claim 1, wherein an impurity concentration of said semiconductor substrate is $1\times10^{19}$ $cm^{-3}$ or more.

5. A semiconductor device according to claim 4, wherein dopant of said semiconductor substrate is arsenic (As).

6. A semiconductor device according to claim 1, wherein said high-concentration region is a gettering site for causing contaminant impurities existing in a proximity of said concavity to be reduced.

7. A semiconductor device according to claim 6, wherein said high-concentration region is formed to reach from a surface of said semiconductor layer to said semiconductor substrate.

8. A semiconductor device according to claim 7, further comprising a drain electrode contacting said high-concentration region.

9. A semiconductor device according to claim 6, wherein an impurity concentration of said semiconductor substrate is $1\times10^{19}$ $cm^{-3}$ or more.

10. A semiconductor device according to claim 9, wherein a dopant of said semiconductor substrate is arsenic (As).

* * * * *